United States Patent [19]

Okura et al.

[11] Patent Number: 5,362,354
[45] Date of Patent: Nov. 8, 1994

[54] APPARATUS FOR MANUFACTURING A SEMICONDUCTOR DEVICE

[75] Inventors: Hiroyuki Okura, Tokyo; Toshimitsu Ishikawa, Kawaguchi, both of Japan

[73] Assignee: Kabushiki Kaisha Toshiba, Kawasaki, Japan

[21] Appl. No.: 102,758

[22] Filed: Aug. 6, 1993

[30] Foreign Application Priority Data

Aug. 12, 1992 [JP] Japan ................. 4-214992

[51] Int. Cl.⁵ ................................ B05C 1/08
[52] U.S. Cl. ..................... 156/356; 156/578; 118/243; 118/258
[58] Field of Search ............... 156/297, 299, 356, 578; 29/832; 427/428; 118/238, 241, 243, 258, 261, 244

[56] References Cited

U.S. PATENT DOCUMENTS 3,958,740 5/1976 Dixon ................... 118/238
4,569,864 2/1986 McIntyre .............. 427/428

*Primary Examiner*—Michael Ball
*Assistant Examiner*—Richard Crispino
*Attorney, Agent, or Firm*—Finnegan, Henderson, Farabow, Garrett & Dunner

[57] ABSTRACT

A dispenser unit is provided on one side of a conveying rail and a wafer is provided on the other side of the conveying rail. A tube is attached at one end to the dispensing unit and at the other end to a syringe. First and second shafts are attached at their base ends to the dispensing unit. A satellite roller and movable roller are mounted on the forward ends of the first and second shafts. The satellite roller and movable roller are mounted such that they are rotatable. A movable mechanism is mounted on the dispensing unit to move a semiconductor element from a wafer onto a lead frame. The movable roller is moved to coat a bonding agent on a rear surface of the semiconductor element.

6 Claims, 6 Drawing Sheets

APPARATUS FOR MANUFACTURING A SEMICONDUCTOR DEVICE

BACKGROUND OF THE INVENTION

1. Field of the Invention

The present invention relates to an apparatus for manufacturing a semiconductor device and, in particular, an apparatus for the manufacture of a semiconductor device which bonds a semiconductor element by a bonding agent on a lead frame.

2. Description of the Related Art

FIGS. 7, 8 and 9A to 9C show the steps for placing a semiconductor element on a lead frame by a conventional apparatus for manufacturing a semiconductor device.

A bonding agent coating section 10 is provided on a conveying rail 2 for conveying a lead frame 1. A dispensing unit 3 is provided on one side of the conveying rail 2. A wafer 4 having a plurality of semiconductor elements 4a is arranged on the other side of the conveying rail 2. A nozzle (11)-equipped syringe 5 is provided on the dispensing unit 3 and is movable in a direction as indicated by a first arrow 7 in FIGS. 7 and 8. A moving means mechanism 8 has its base end mounted on the dispensing unit 3 and its forward end extending toward the other side of the conveying rail 2. A pickup head 6 is mounted on the forward end of the moving means 8.

In the arrangement shown, the lead frame 1 is conveyed by a conveying rail 2 toward a direction as indicated by a second arrow 9 in FIG. 7 and is sent to the bonding agent coating section 10. Thereafter, the bonding agent 12 is applied, as a few drops, on a semiconductor element placing section of the lead frame 1 (FIG. 9A) by means of the nozzle 11 as shown in FIG. 9B.

As shown in FIG. 8, the semiconductor element 4a is sucked by a suction pad, not shown, of the pickup head 6. The pickup head 6 with the semiconductor element 4a sucked there is moved just over the dropwise-applied bonding agent 12 on the semiconductor element placing section of the lead frame 1 by rotating the moving means 8 through a given angle around the pivotal axis of the rotation shaft 8a. Then the semiconductor element 4a is pushed onto the semiconductor element placing section 1a on which the bonding agent has been dropwise applied. As shown in FIG. 9C, the semiconductor element 4a is bonded by the bonding agent to the semiconductor element placing section 1a.

Then a wire bonding step is carried out, followed by a packaging step.

Since, in the conventional apparatus, the bonding agent 12 is applied by the nozzle 11 on the semiconductor element placing section 1a of the lead frame, there occurs a variation in a thickness layer of the bonding agent applied dropwise. At that time, the bonding agent may be locally dropped as thick deposits so that, when a package is to be formed as a thinner one, the formation of such thick deposits provides a bar to the thinning of that package.

In the conventional apparatus, since the bonding agent 12 is applied as a few drops to the semiconductor element placing section 1a by means of the nozzle 11, the bonding agent 12 is not adequately distributed over the whole surface of the semiconductor element placing section, that is, less wettability occurs between the bonding agent and the semiconductor element placing section, thus producing an air layer between the semiconductor element placing section 1a and the semiconductor element 4a upon bonding them by the bonding agent. When this occurs, moisture is liable to be retained in the air layer at a reliability test such as a PCT (pressure cooker test), thus posing a reliability problem against the semiconductor device.

In the case where the bonding agent 12 is provided as an insulating layer between the semiconductor element 4a and the lead frame 1, an electric leak occurs between the semiconductor element 4a and the lead frame 1 due to the moisture in the air layer.

SUMMARY OF THE INVENTION

It is accordingly the object of the present invention to provide an apparatus for manufacturing a semiconductor device, which can form a thin package of high reliability by very thinly and uniformly coating a bonding agent to a semiconductor element.

According to the present invention there is provided an apparatus for manufacturing a semiconductor device, comprising:

a first roller rotatably mounted to allow a bonding agent to be applied dropwise thereon;

a second roller mounted adjacent the first roller to allow the bonding agent to be thinly and uniformly spread throughout upon being rotated; and moving means for moving a semiconductor element so as to coat the bonding agent on a rear surface of the semiconductor element and bond the semiconductor element by the bonding agent to a lead frame.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9A being a perspective view showing a lead frame; FIG. 9B a perspective view showing the lead frame in a step for coating a bonding agent on a semiconductor element placing section and FIG. 9C a perspective view showing a lead frame in a step for bonding a semiconductor element to the semiconductor element placing section.

DETAILED DESCRIPTION OF THE PREFERRED EMBODIMENTS

The embodiment of the present invention will be explained below with reference to the accompanying drawings.

Figure 1:
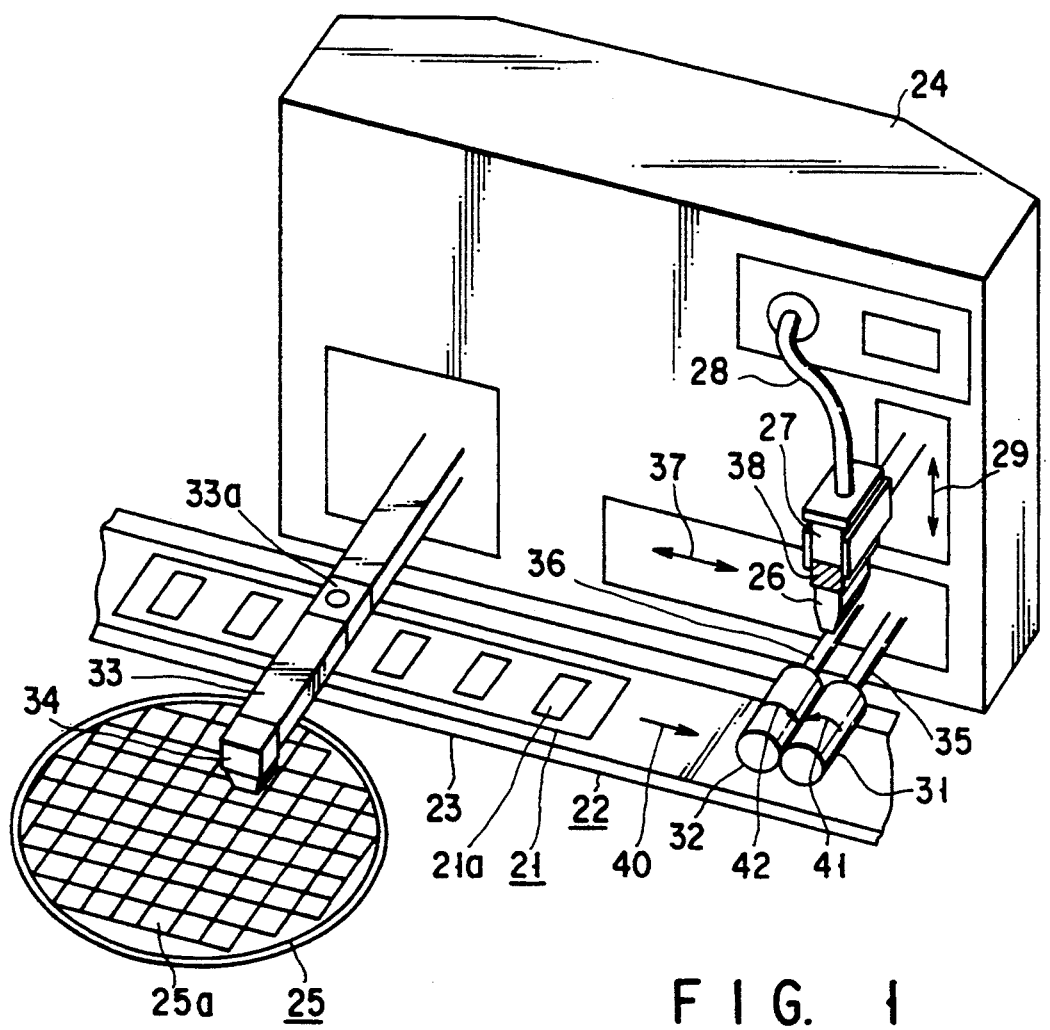
FIG. 1 is a perspective view showing an apparatus for manufacturing a semiconductor device which corresponds to a first embodiment of the present invention.
Figure 2:
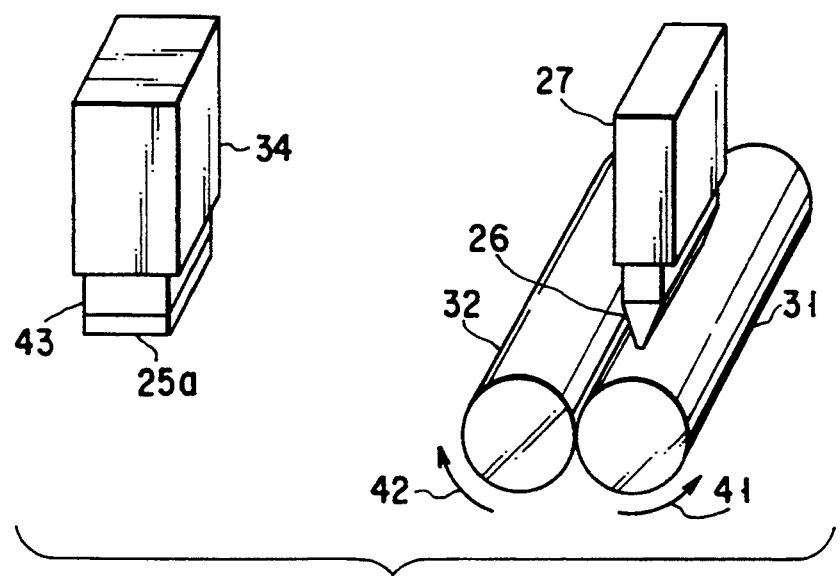
FIG. 2 is a perspective view showing a major section of the first embodiment in a step being followed by a step shown in FIG. 1.
Figure 3:
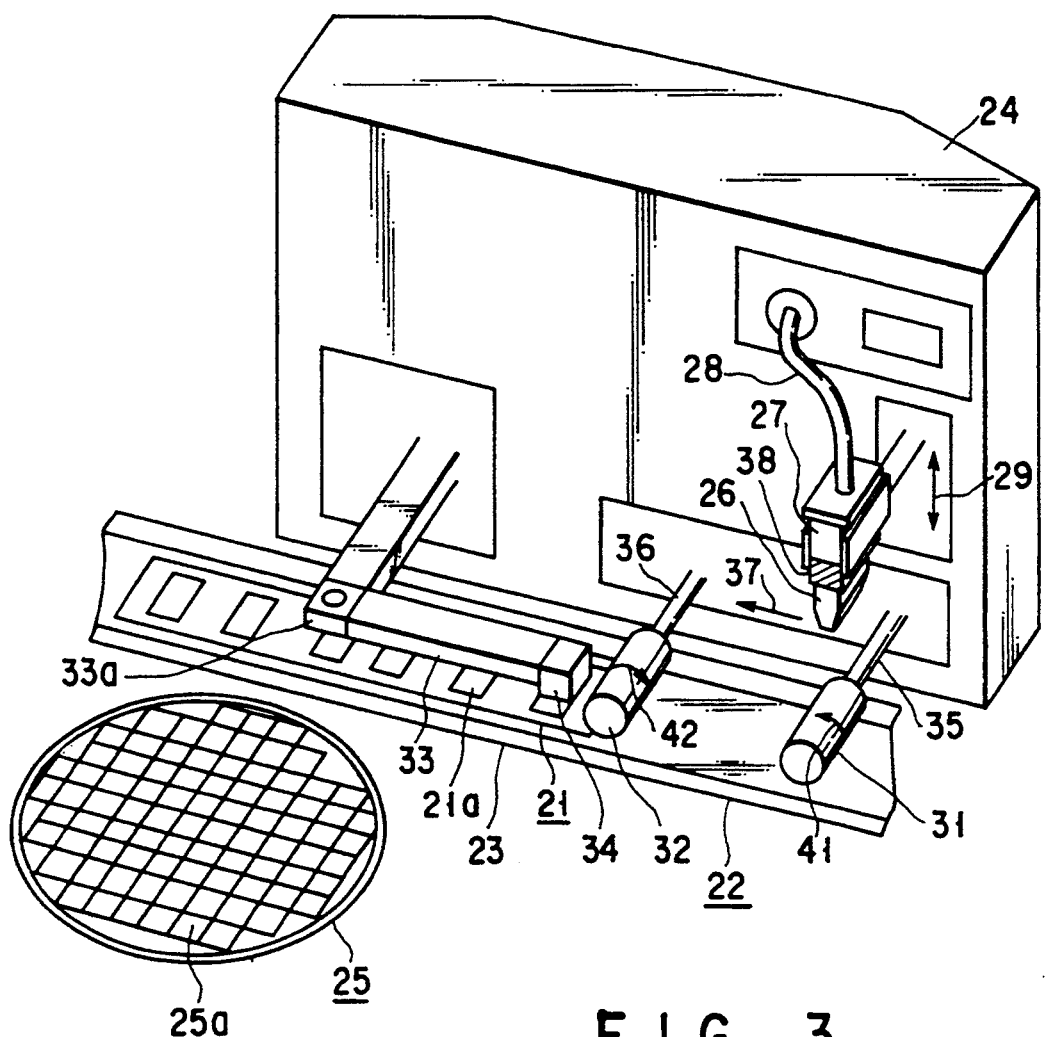
FIG. 3 is a perspective view showing the first embodiment in a step followed by the step shown in FIG. 2.
Figure 4:
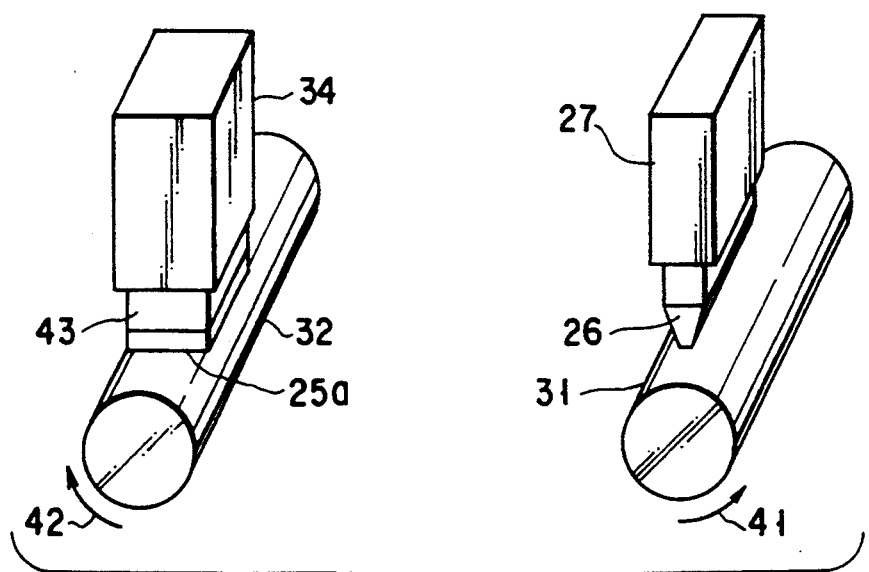
FIG. 4 is a perspective view showing a major section of the first embodiment in a step followed by the step shown in FIG. 3.

FIGS. 1 to 4 show a method for manufacturing a semiconductor device by a first embodiment of the present invention: FIGS. 1 and 3 show a perspective view showing an apparatus for manufacturing a semiconductor device and FIGS. 2 and 4 are a perspective view showing a major section in the present apparatus.

As a shown in FIGS. 1 and 3, a bonding agent coating section 23 is provided on a conveying rail 22 for conveying a lead frame 21. A dispensing unit 24 is provided on one side of the conveying rail 22 and a wafer 25 with a plurality of semiconductor elements 25a is located on the other side of the conveying rail 22.

A tube 28 has one end mounted on the dispensing unit 24 to supply a compressed air. A nozzle (26)-equipped syringe 27 is provided on the other end of the tube 28. The syringe 27 is adapted to be movable in a direction of a first arrow 29.

First and second shafts 35 and 36 have their base ends mounted on the dispensing unit 24. The satellite roller 31 and movable roller 32 are mounted on the forward ends of the first and second shafts 35 and 36, respectively. The movable roller 32 and satellite roller 31 are arranged in a side-by-side relation such that they are rotatable. The movable roller 32 is movable in a direction of a second arrow 37 in FIG. 1.

A moving means 33 has its base end mounted on the dispensing unit 24. A forward side of the moving means 33 extends toward the other side of the conveying rail 22. A third shaft 33a is provided on the moving means 33 such that it is situated above the conveying rail 22. A pickup head 34 is mounted on the forward end of the moving means 33. The pickup head 34 is equipped with a suction means not shown.

In the arrangement as set out above, as shown in FIG. 1, the lead frame 21 having semiconductor element placing sections 21a is conveyed by the conveying rail 22 in a direction of a third arrow 40 to the bonding agent placing section 23. Then the movable roller 32 is rotated in a direction of a fifth arrow 42 with the rotation of the second shaft 36 by a motor not shown. This causes the satellite roller 31 which contacts with the movable roller 32 to be rotated in a direction of an arrow 41 in FIG. 1. Whether or not the satellite roller 31 is contacted with the movable roller 32 is determined depending upon the surface states of these rollers 31 and 32 and the viscosity of the bonding agent 38. The satellite roller 31 may be separated from the movable roller 32.

As shown in FIG. 2, the syringe 27 is moved downward. The bonding agent 38 is applied dropwise to the satellite roller 31, by a nozzle 26, which is rotated in the direction of the fourth arrow 41 in FIG. 1. The bonding agent, not shown, which is applied dropwise is uniformly spread on the surface of the movable roller 32 with the rotation of the rollers 31 and 32. A suction pad 43 is mounted on the pickup head 34 to suction hold the semiconductor element 25a.

As shown in FIG. 3, the semiconductor element 25a of the wafer 25 is sucked by the suction pad 43 mounted on the pickup head 34. The pickup head 34 with the semiconductor element 25a sucked there is rotated, through a given angle, about a pivotal axis of the rotation shaft 33a and brought to a position above the lead frame 21. Then the movable roller 32 is moved in the direction of the second arrow 37.

Then as shown in FIG. 4 the movable roller 32 moved to a position beneath the semiconductor element 25a sucked on the suction pad 43. By rotating the movable roller 32 in the direction of the fifth arrow 42 the bonding agent 38 spread on the surface of the movable roller 32 is uniformly coated on the rear surface of the semiconductor element 25a. Then the movable roller 32 is moved to a position where it is contacted with the satellite roller 31 as shown in FIG. 1. Then the coated semiconductor element 25a is pushed onto the semiconductor element placing section 21a by the moving means 33 so that the semiconductor element 25a is bonded by a bonding agent 38 to the semiconductor element placing section 21a.

According to the first embodiment, the first and second shafts 35 and 36 have their base ends mounted on the dispensing unit 24. The satellite roller 31 and movable roller 32 are mounted on the forward ends of the first and second shafts, respectively. The bonding agent 38 is applied dropwise to the satellite roller 31 and the rollers 31 and 32 are rotated whereby the bonding agent 38 on the satellite roller 31 is transferred to the movable roller 32 and adequately thinly and uniformly spread on the surface of the movable roller 32. With the rotation of the movable roller 32 the bonding agent 38 is coated on the rear surface of the semiconductor element 25a. It is possible to very thinly and uniformly transfer the bonding agent 38 to the whole rear surface of the semiconductor element 25a and hence to achieve a bond with an adequate wettability. It is thus possible to prevent an uneven coating of the bonding agent 38 on the rear surface of the semiconductor element and the formation of any air layer at a bond between the semiconductor element 25a and the semiconductor element placing section 21a. As a result, a package can be thinly manufactured with high reliability.

Figure 5:
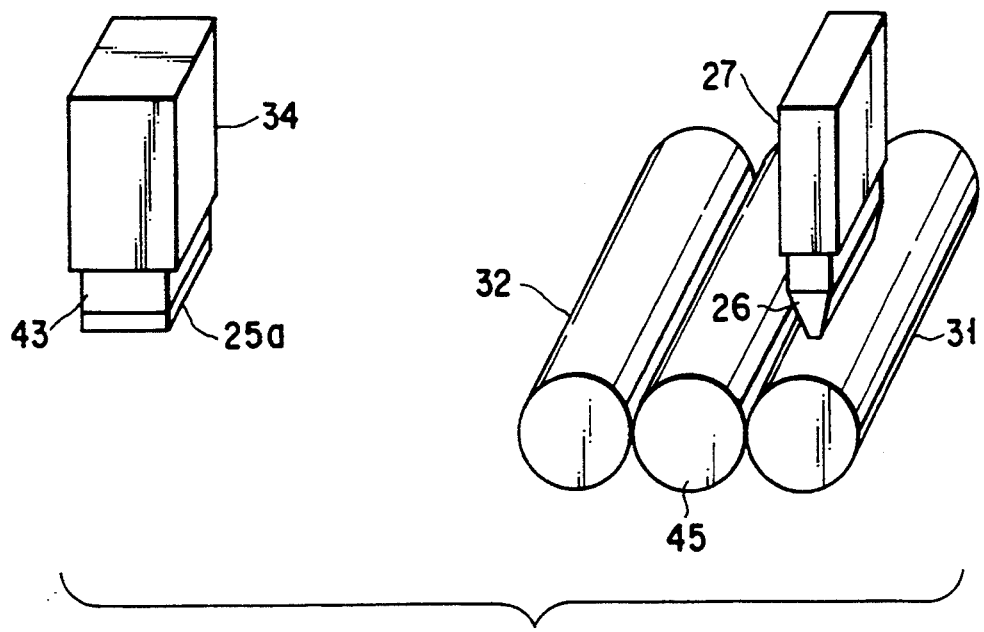
FIG. 5 is a perspective view showing a major section of an apparatus according to a second embodiment of the present invention.

FIG. 5 is a perspective view showing a major section of a present apparatus according to a second embodiment of the present invention. In FIG. 5 the same reference numerals are employed to designate parts or elements corresponding to those shown in FIG. 2 and only those different portions will be explained below.

First to third shafts, not shown, have their base ends mounted on a dispensing unit not shown. First and second satellite rollers 31 and 45 are provided on the forward ends of the first and second shafts and the movable roller 32 is provided on the forward end of the third shaft.

Even in the second embodiment it is possible to obtain the same effects as in the first embodiment. The provision of the first and second satellite rollers 31 and 45 ensures more uniform spreading of a bonding agent on the surface of the movable roller 32.

Figure 6:
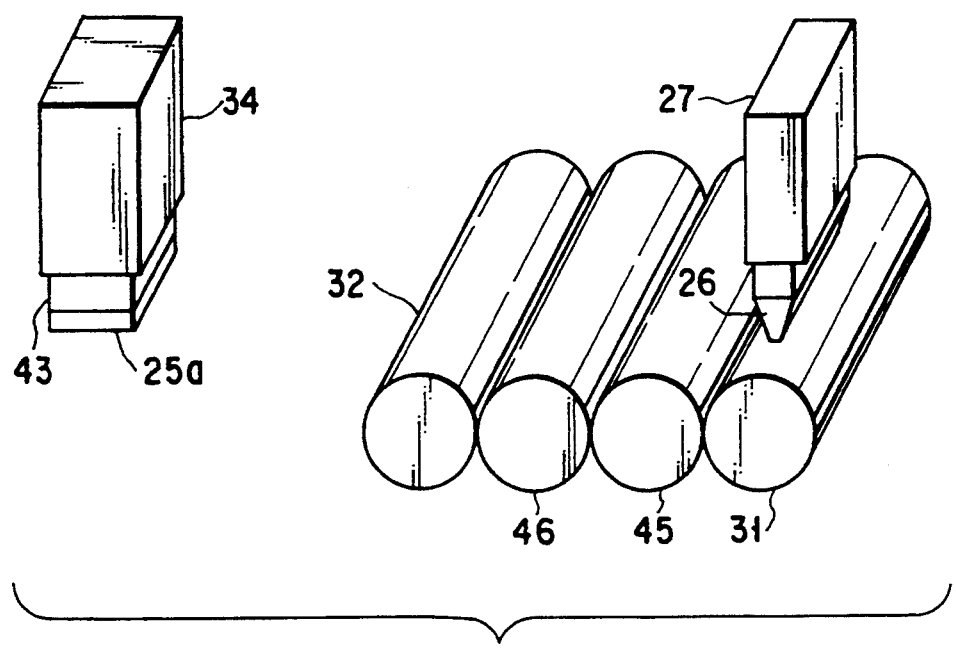
FIG. 6 is a perspective view showing a major section of an apparatus according to a third embodiment of the present invention.
Figure 7:
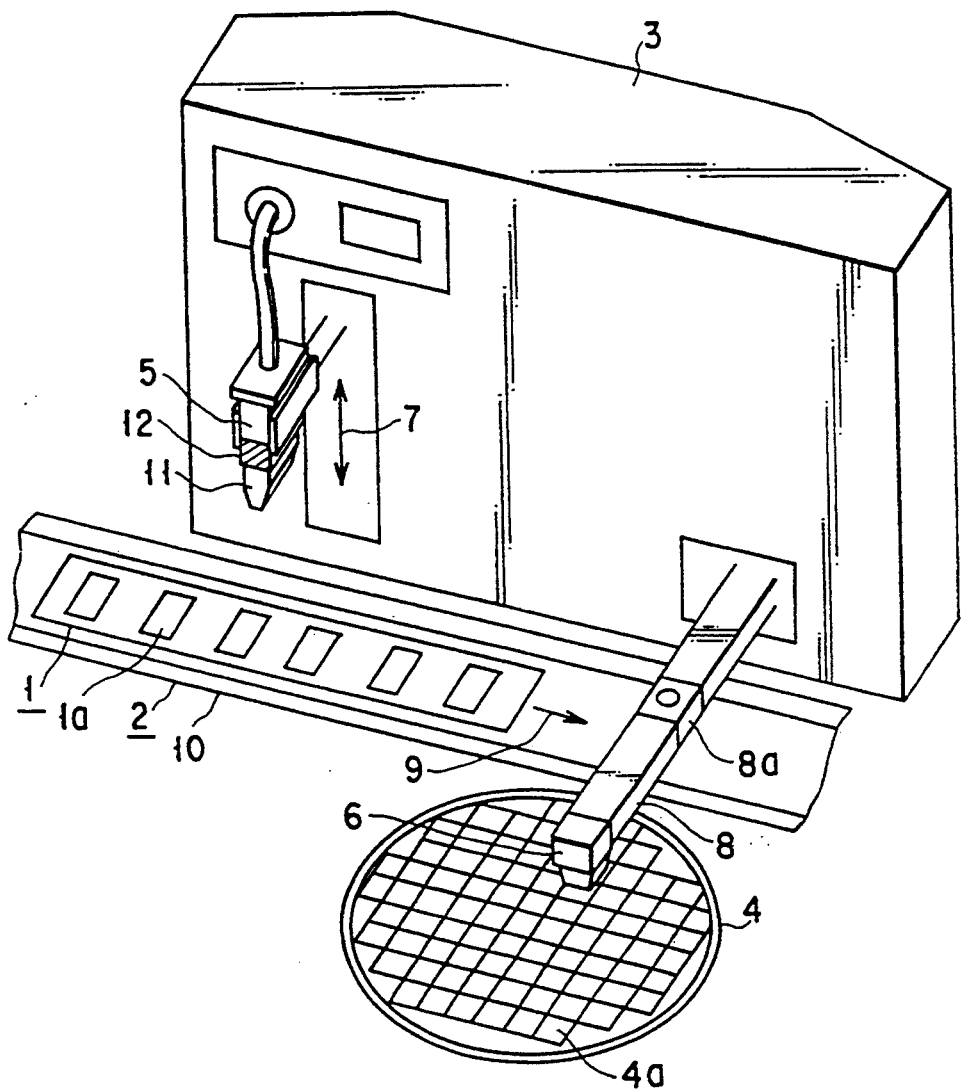
FIG. 7 is a perspective view showing a conventional apparatus for manufacturing a semiconductor device, a step illustrating a step for coating a bonding agent on a semiconductor element placing section.
Figure 8:
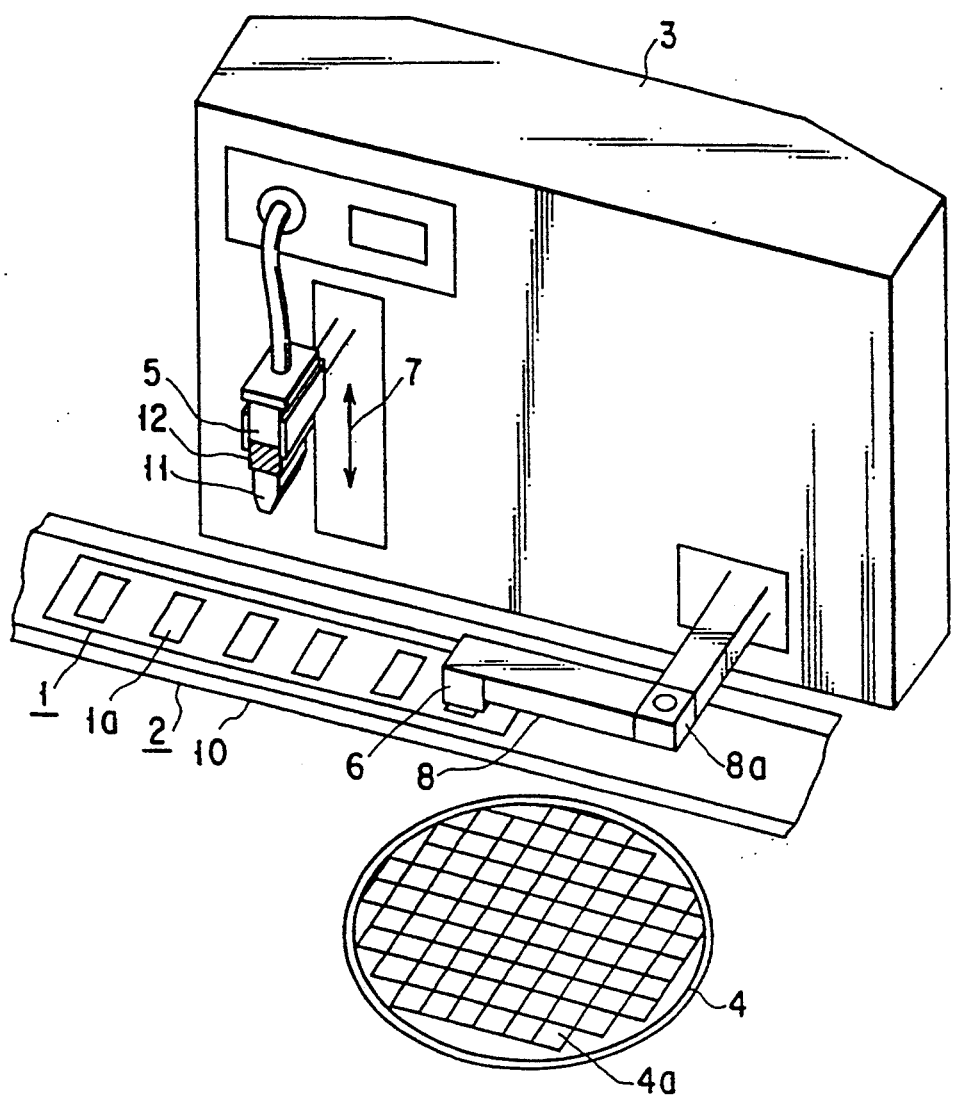
FIG. 8 is a perspective view showing the conventional apparatus, a step illustrating a step for bonding a semiconductor element to a semiconductor element placing section by a bonding agent.
Figure 9A:
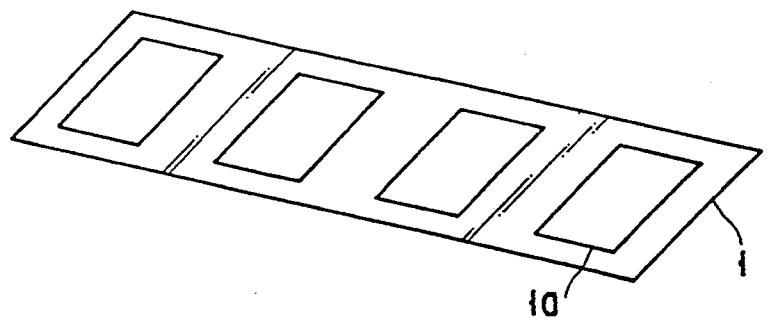
FIGS. 9A to 9C shows the steps of manufacturing a semiconductor device by the conventional apparatus.
Figure 9B:
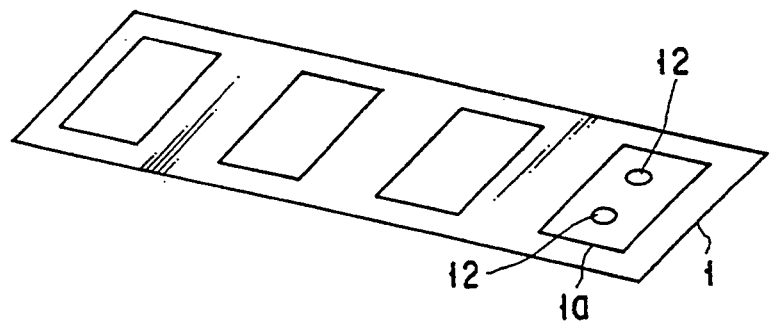
Figure 9C:
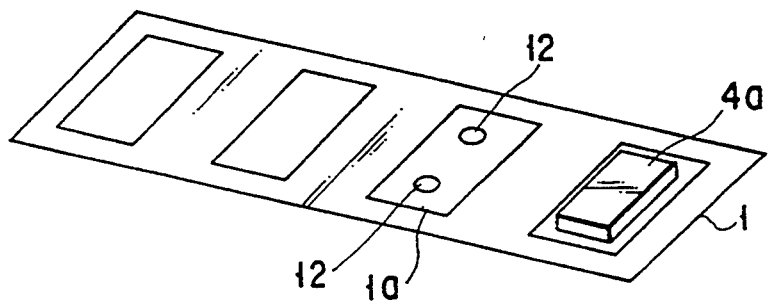

FIG. 6 is a perspective view showing a major section of a present apparatus according to a third embodiment of the present invention where the same reference numerals are employed to designate parts or elements corresponding to those shown in the first embodiment of the present invention. Only those different portions will be explained below.

First to fourth shafts, not shown, have their base ends mounted on a dispensing unit not shown. First to third satellite rollers 31, 45 and 46 are mounted on the forward ends of first to third shafts and a movable roller 32 is mounted on a fourth shaft. The third embodiment can also obtain the same advantages as in the second embodiment.

The present apparatus is not restricted to the aforementioned embodiments only and four or more satellite rollers can be provided instead.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An apparatus for manufacturing a semiconductor device, comprising:
    a first roller means rotatably mounted to receive a bonding agent;
    means for moving a semiconductor element from a wafer onto a lead frame; and
    a second roller rotatably mounted adjacent to the first roller means so that the bonding agent is thinly and uniformly spread on the surface of the second roller during rotation thereof, the second roller being movable to apply a coat of the bonding agent on a rear surface of the semiconductor element while the moving means moves the semiconductor element.

2. The apparatus according to claim 1, wherein the first roller means comprises a plurality of rollers adjacent to each other.

3. The apparatus according to claim 1, further comprising means for conveying the lead frame.

4. The apparatus according to claim 1, further comprising means for suction holding the semiconductor element provided on the moving means.

5. The apparatus for manufacturing a semiconductor device, comprising:
    a first rotatable roller means;
    means for applying a bonding agent to the first roller means;
    means for moving a semiconductor element from a wafer onto a lead frame;
    means for suction holding the semiconductor element mounted on the moving means;
    conveying means for conveying the lead frame; and
    a second rotatable roller mounted adjacent to the first roller to allow the bonding agent to be thinly and uniformly spread on the surface of the second roller during rotation thereof, the second roller being movable to apply a coat of the bonding agent on a rear surface of the semiconductor element while the moving means moves the semiconductor element.

6. The apparatus according to claim 5, wherein the first roller comprising a plurality of rollers adjacent to each other.

* * * * *